HEAT SINK ASSEMBLY FOR SEMICONDUCTOR DEVICES

Filed Jan. 15, 1968 2 Sheets-Sheet 1

INVENTORS
RAYMOND M. CRAIG
JAMES W. CROWE
EARL L. WILKIE

BY

ATTORNEY

April 28, 1970 R. M. CRAIG ET AL 3,509,429

HEAT SINK ASSEMBLY FOR SEMICONDUCTOR DEVICES

Filed Jan. 15, 1968 2 Sheets-Sheet 2

United States Patent Office 3,509,429
Patented Apr. 28, 1970

3,509,429
HEAT SINK ASSEMBLY FOR SEMICONDUCTOR DEVICES

Raymond M. Craig and James W. Crowe, Yorktown Heights, and Earl L. Wilkie, Peekskill, N.Y., assignors to International Business Machines Corporation, Armonk, N.Y., a corporation of New York Filed Jan. 15, 1968, Ser. No. 697,730
Int. Cl. H01l 5/02
U.S. Cl. 317—234 4 Claims

ABSTRACT OF THE DISCLOSURE

A heat sink assembly is provided for semiconductor devices having widths greater than 10 mils and which planar contact surfaces need not be precisley parallel to one another. There is provided a pair of electrically and thermally conductive members between which the semiconductor device is sandwiched. A layer of an uncured epoxy bonding material is coated on the opposed surfaces of the first member; i.e., surfaces on either side of the semiconductor device. The second member is positioned onto the upper surface of the semiconductor device by an applied force. Because of the plastic flow of the uncured epoxy bonding material the second member rotates until it precisely aligns itself with the contact surface of the semiconductor device. Once the second member is aligned as above, the epoxy bonding material is cured to effect the bonding together of the electrically and thermally conductive members. Thus the first and second members are maintained in intimate contact with the contact surfaces of the semiconductor device.

DESCRIPTION OF THE PRIOR ART

Generally, semiconductor devices are temperature sensitive and proper cooling of such devices is required to enhance their operating characteristics. To effect proper cooling, heat radiators or heat sinks are mounted on or attached to the semiconductor device to dissipate self-inducted heat in the device to the ambient condition. The prior art has provided several heat sink mountings for semiconductor devices which, because they apply only point contacts to the surface of the device, are unsuitable, since they are unable to transfer large quantities of self-induced heat. Thus, the operating characteristics of the device are greatly affected.

A semiconductor device which exhibits a critical temperature dependence is the semiconductor injection laser. It is important that heat sink electrodes establish uniform pressure over the entire surface area of the diode in order to achieve both uniform thermal contact and uniform electrical contact thereat. Further, the frequency and, consequently, the intensity of the emitted light from the junction is related to the pressure on the diode as described in copending patent application Ser. No. 234,154 by John C. Marinace, filed Oct. 30, 1962, and assigned to the assignee hereof, for modulation of electromagnetic radiation in solid state devices. Accordingly, it is important that a heat sink be applied on the mounting surface of the semiconductor device with controllable and uniform pressure over the entire width of the device so as to achieve essentially uniform thermal and electrical contact. Prior art devices have not been able to provide the desirable characteristics of a heat sink and semiconductor device assembly according to requirements set forth above.

An advance semiconductor heat sink mounting design is presented in U.S. Patent No. 3,351,698 to John C. Marinace, filed Nov. 13, 1964, and issued Nov. 7, 1967, and assigned to the assignee hereof. This prior art heat sink mounting comprises a pair of planar members which are formed of a pair of resilient conductive members. The planar members are rigidly supported at one end portion on an insulating spacer to form a cantilever. The semiconductor device is inserted between the other end portion of the planar members, whereat there are planar areas which define terminal contacts that are disposed adjacent to the opposing surfaces of the planar members. Although this latter heat sink is especially advantageous for certain applications, it has not been found suitable for the uniform contacting of a relatively wide device; e.g., greater than 10 mils wide. Nor has the prior art device been found suitable where the contact surfaces of the semiconductor device are not parallel but form a trapezodial configuration.

SUMMARY OF THE INVENTION

This invention provides both a heat sink for a semiconductor device and a method for applying the heat sink to a semiconductor device. The heat sink comprises a first and second member, each having conducting surfaces. The conducting surface of each member intimately matches the planar contact surfaces of the semiconductor device. The match is accomplished regardless of any non-parallel nature of the contact surfaces of the device which are involved. This is particularly important, since the nature of a semiconductor p-n junction laser diode requires that there be established a uniform pressure over the entire junction area. The uniform pressure permits uniform thermal contact and electrical contact between the device surfaces and the respective matching conductive surfaces of the heat sink. The uniform pressure on the entire junction area permits a homogeneous frequency spectrum at each point along the diode junctions at the radiating faces. During the fabrication steps of the method of this invention, a semiconductor device with planar surfaces for matching with the conductive surfaces of the heat sink assembly is prepared by conventional technique. For example, one such technique is described in the above-mentioned U.S. Patent No. 3,351,698, the description of which is herein incorporated. A thin layer of a conductive material having plastic properties, e.g., indium, is coated on the conductive surfaces of the heat sink which are to contact the semiconductor device terminals. Similarly, a thin coating of the same or similar conductive material is also coated on the planar surfaces of the semiconductor device to thereby establish terminals thereon. The device is positioned parallel to and on the matching surface of the heat sink first member. The second heat sink member is positioned to conform with the other contact surface of the device. A force is directed through the second member being positioned uniaxially through the semiconductor device into the other heat sink member on which the device has previously been established. A mechanical couple is established between the resisting force of the device and the applied force which penetrates the device itself. The mechanical couple rotates the second member into planar contact relationship with the device. An electrically insulating bonding material which has the characteristic that it is viscous in its prepared condition, so that it offers relatively little resistance to the applied force, is applied between the ends of the first and second heat sink members. The electrically insulating bonding material can be uncured epoxy resins or some other thermosetting or thermoplastic material such as black wax, glycol thiolate, etc. Epoxy resin bonding materials are used in preferred embodiments of this invention since it has the beneficial characteristics that during the positioning of the heat sink assembly it flows plastically; and after the assembly has been established in its final condition, it hardens and shrinks somewhat to make a firm bonded structure. Any suitable epoxy material prepared from an epoxy and a polyhydric phenol can be used.

It is an object of this invention to provide a heat sink assembly for a semiconductor device.

It is another object of this invention to provide a heat sink assembly for a semiconductor laser junction diode and a method for applying it whereby planar surfaces of the diode utilized for electrical and thermal contact are established in planar relationship with the conductive surfaces of the heat sink assembly.

It is another object of this invention to provide a heat sink assembly for a semiconductor device which has planar contact surfaces which are nonparallel planes.

It is another object of this invention to provide a heat sink assembly for a semiconductor laser junction diode which applies uniform pressure over opposite planar surfaces utilized for both electrical contact and thermal contact whereby the junction of the diode has a uniform stress thereon.

It is another object of this invention to provide a heat sink assembly for a semiconductor device and a method for applying it whereby the device is mounted firmly, has uniform electrical contact and thermal contact to the respective surfaces of the device and uniform pressure is applied over the entire volume of the device at the active junction area thereof.

The foregoing and other objects, features and advantages of the invention will be apparent from the following more particular description of a preferred embodiment of the invention, as illustrated in the accompanying drawings.

The figures present illustrations of the heat sink assembly with semiconductor devices in both assembled and partial assembled forms, and the graph of data revealing special aspects of the operation of a semiconductor p-n laser diode with which the invention is desirably practiced.

Figure 1:
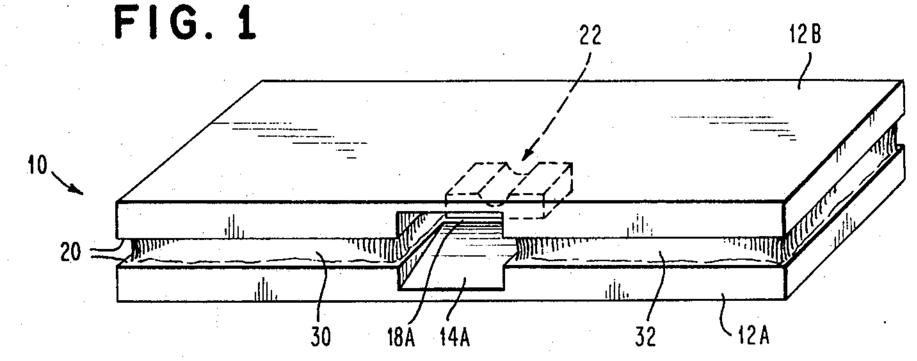
FIG. 1 is a perspective view of an assembled heat sink with a semiconductor device mounted therein illustrating the uniform contact obtained by the method of this invention.

In FIG. 1 the heat sink assembly, according to the practice of this invention, is pictorially shown with a phantom outline of the semiconductor diode 22 incorporated therewith. Assembly 10 comprises a pair of heat sink members 12A and 12B. Heat sink members 12A and 12B have cutout portions 14 and 16 on either side of a diode pedestal ledge 18. Cutout portions 14 and 16 are provided to permit the exiting of light from the diode 22. Members 12A and 12B may be fashioned from molybdenum, copper, silver, tungsten, etc. Diode pedestal ledge 18 is a continuous portion of the surface 20 of members 12A and 12B. For illustrative purposes each of the members 12A and 12B is presumed to be of identical structure and accordingly respective numbers are identified by the designator A or B dependent upon which particular aspect of each member is being designated. Diode 22 has a portion 24 removed therefrom to permit it to manifest to independent laser portions 26 and 28 each having a p-type region and an n-type region. The n-type region common to both diode portions 26 and 28 rests on ledge 18A. An uncured epoxy layer is established on the upper surface of lower member 12A, on both the left hand portion 30 and the right hand portion 32, in such quantities that when the upper member **12*b* is positioned in planar contact with the upper surface of diodes 26 and 28, there is a firm bond established between the two member structures at both extremities. The epoxy layers 30 and 32 are present in such quantities as not to flow unduly, to obstruct the diode 22 ledge portions 14A and 16A, as well as the matching ledge portions on electrode 12B**.

Figure 2A:
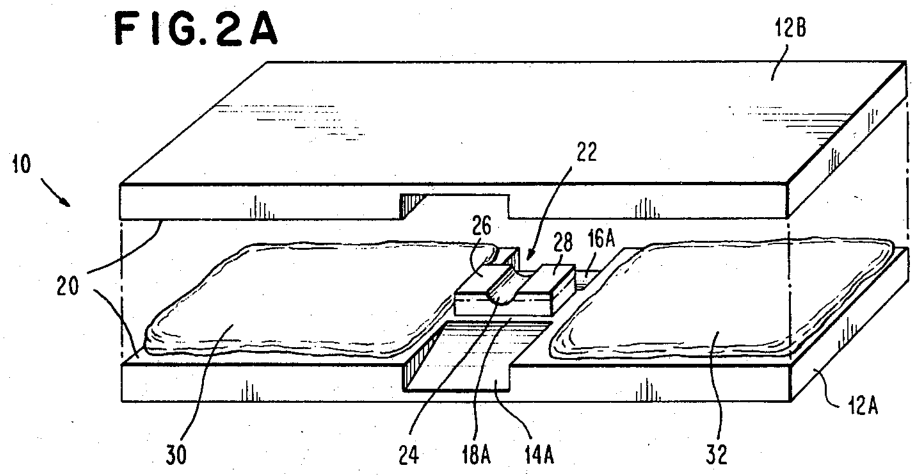
FIG. 2A is an exploded view of the several components of the assembly of FIG. 1.
Figure 2B:
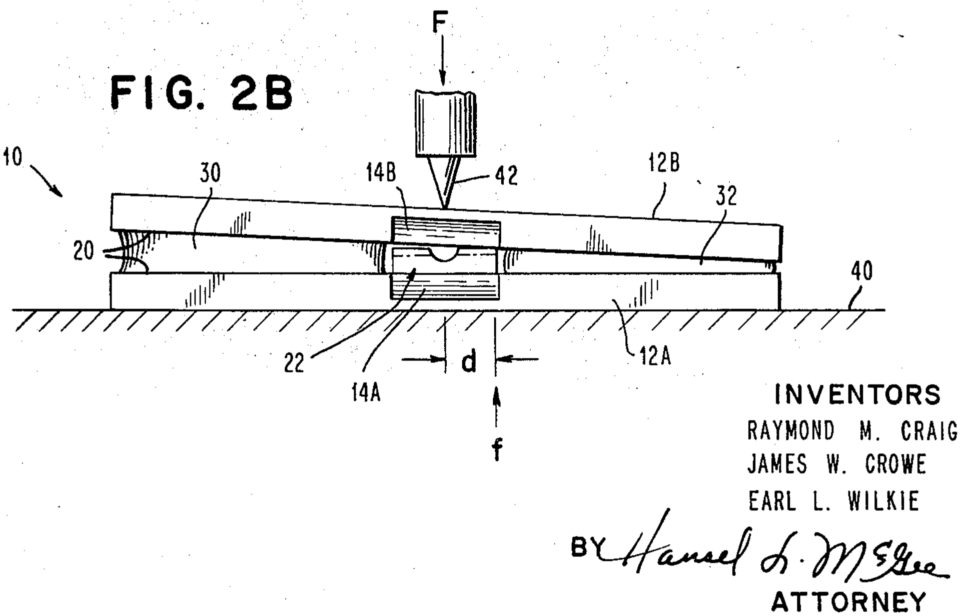
FIG. 2B is a perspective view of an intermediate situation during fabrication of the assembly of FIG. 1 from the components of FIG. 2A illustrating the principles of this invention.

According to the practice of this invention as illustrated in FIG. 2B, diode ledge portions of heat sink members 12A and 12B are coated with a thin film of a soft conductive material; e.g., indium. The major surfaces of diode 22 are similarly coated with a like conductive material. The coated member 12A is positioned on a rigid flat plate 40. The heat sink members 12A and diode 22 are established in condition as presented in FIG. 2B ready to receive the upper heat sink 12B. The upper member 12B shown in FIG. 2B is positioned in contact with the diode 22. Diode 22 supports the upper member 12B at a corner thereof as shown by the upward arrow force. The weight of member 12B acting through its gravitational vector tends to rotate into planar surface contact with the upper face of diode 22, if the member 12B is not oriented perfectly relative to the top surface of diode 22. Cooperating with the gravitational vector is a pressure probe 42 operated by an externally applied pressure indicated by F. As pressure is applied the epoxy layer 32 is caused to flow and deforms in the right hand portion between lower heat sink member 12A and upper heat sink member 12B and to the extent that contact with epoxy 30 is made on the left hand it is extended between lower member 12A and upper member 12B. As upper heat sink member 12B is being rotated into planar contact on the upper face of diode 22, there is a mechanical couple established by the Forces (F and *f*) which effectively accomplish the rotation. Because the upper face of diode 22 is planar, the force F ultimately establishes the ledge 18B of heat sink member 12B in intimate contact with ledge 18B of upper heat sink electrode 12B. The applied forces are maintained so as to create pressures on diode 22 in the range of from about 200 to 1000 atmospheres. The applied pressure effectively establishes a cold weld between the indium coated surfaces of diode 22 and the like coated surfaces of members 12A and 12B. Good electrical contact is thusly made. After member 12B has found the plane of diode 22 precisely, the epoxy layers 30 and 32 are cured. Curing may be effected by subjecting the epoxy to high temperatures or allowing it to set for an extended period of time. When the epoxy becomes rigid it shrinks slightly thus applying an additional force on diode 22 to make a good thermal contact between said diode 22 and the members 12A and 12B.

Figure 3:
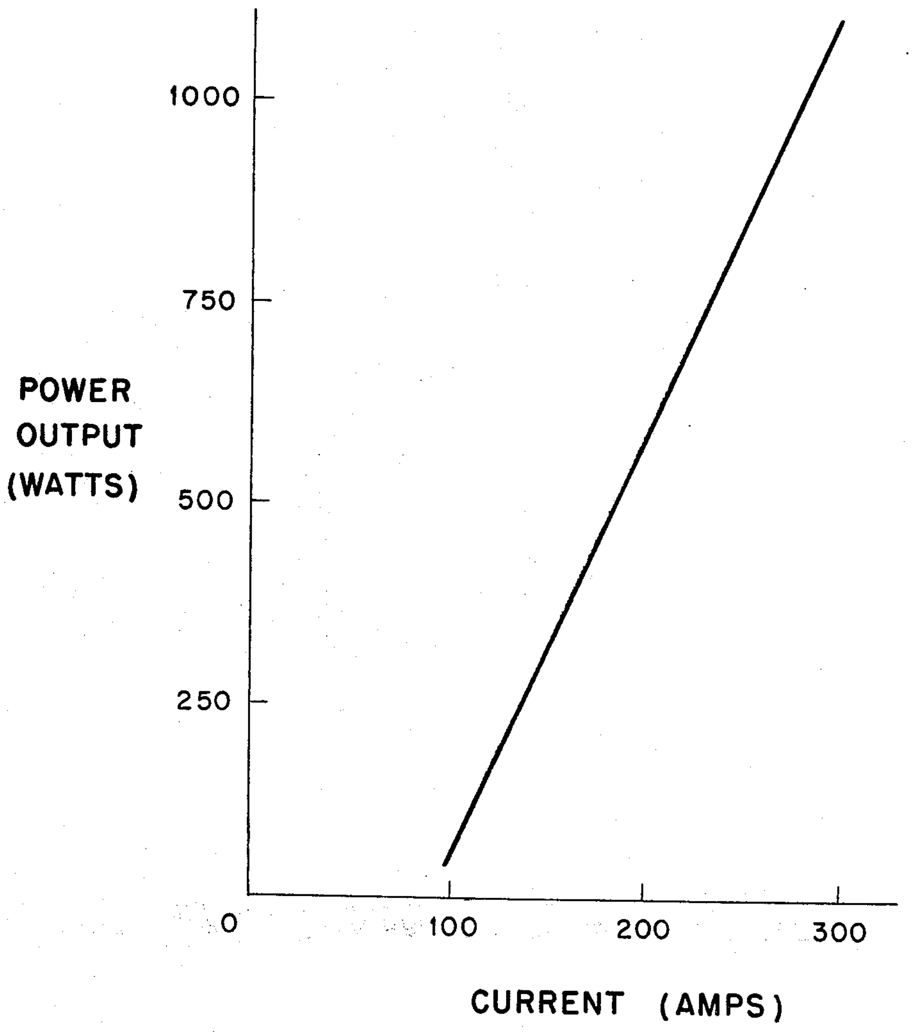
FIG. 3 is a graph of peak power output plotted against input current for a five diode array having the heat sink assembly of this invention and operated at 77° K.

FIG. 3 shows a plot of output power versus current for a five diode array having the heat sink assembly of this invention. An output of 1000 watts was obtained with an input current of 300 amperes. Each of the five diodes has a width of 25 mils. The diodes are purposely made wide in order to take advantage of the best beam width. An output of about 200 watts is obtainable from each such diode. Diodes prior to this invention were generally limited to widths of 10 mils or less and at best outputs of 50 watts were obtainable. This limitation was due mainly to the inadequacies of the prior art heat sink assemblies.

In summary, an improved heat sink assembly and a method of applying the same to semiconductor diodes has been described. The heat sink members are essentially self-aligning. The upper member of the assembly is applied to the upper planar surface of the diode in such as way that a uniaxial force applied to said upper member effects a mechanical couple with the diode, so as to rotate or otherwise position the upper firmly in contact with the planar surface of the diode. The heat sink members are finally bonded together by means of an electrically insulating bond material which has been priorly placed between said members. As a result of this invention, efficient semiconductor laser diodes can be prepared having widths as great as 50 mils or greater, thereby obtaining greater outputs therefrom.

While the invention has been particularly shown and described with reference to a preferred embodiment thereof, it will be understood by those skilled in the art that various changes in form and details may be made therein without departing from the spirit and scope of the invention.

What is claimed is:

1. A heat sink assembly for semiconductor devices having non parallel contact surfaces comprising:

rigid first and second heat sink members having planar surfaces and made of electrical and thermoconductive materials;

a semiconductor device having non parallel planar contact surfaces inserted between said first and and second heat sink members and having planar areas defining terminal contacts which are disposed adjacent to opposing surface areas of said planar members;

a thin film of conductive material interposed between said opposing surface areas of said first and second members and said non parallel planar areas of said semiconductor device to form a cold weld therebetween;

an electrically insulating bonding material inserted between the opposing ends of said first and second members, said bonding material having plastic flow to provide a bond between said first member and second member thereby maintaining said members in electrical and thermal contact with said non parallel contact surface of said semiconductor device.

2. A heat sink assembly for semiconductor devices according to claim 1 wherein said first and second members have cutouts fashioned therein to permit the exit of light emanating from said semiconductor device.

3. A heat sink assembly for semiconductor devices according to claim 1 wherein said semiconductor devices have widths greater than 10 mils.

4. A heat sink assembly for semiconductor devices according to claim 1 wherein said electrically insulating bonding material is an epoxy.

References Cited

UNITED STATES PATENTS

| | | | |
|---|---|---|---|
| 3,351,698 | 11/1967 | Marinace | 174—15 |
| 3,303,432 | 2/1967 | Garfinkel et al. | 331—94.5 |
| 2,909,740 | 10/1959 | Seidel et al. | 174—52 X |

LARAMIE E. ASKIN, Primary Examiner

A. T. GRIMLEY, Assistant Examiner

U.S. Cl. X.R.

174—15, 16